United States Patent
Hedberg et al.

(10) Patent No.: US 9,198,329 B2
(45) Date of Patent: Nov. 24, 2015

(54) METHOD AND CABINET FOR CONTROLLING TEMPERATURE IN THE CABINET

(75) Inventors: Klas Hedberg, Huddinge (SE); Magnus Källmark, Stockholm (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 301 days.

(21) Appl. No.: 13/639,749

(22) PCT Filed: Apr. 22, 2010

(86) PCT No.: PCT/SE2010/050442
§ 371 (c)(1),
(2), (4) Date: Oct. 5, 2012

(87) PCT Pub. No.: WO2011/133076
PCT Pub. Date: Oct. 27, 2011

(65) Prior Publication Data
US 2013/0025314 A1 Jan. 31, 2013

(51) Int. Cl.
*H05K 7/20* (2006.01)

(52) U.S. Cl.
CPC ............ *H05K 7/20609* (2013.01); *H05K 7/207* (2013.01)

(58) Field of Classification Search
CPC ..................... H05K 7/207; H05K 7/20609
USPC ....................................... 62/259.2
See application file for complete search history.

(56) References Cited

U.S. PATENT DOCUMENTS

| | | | |
|---|---|---|---|
| 6,104,003 A | 8/2000 | Jones et al. | |
| 6,886,353 B2 * | 5/2005 | Patel et al. | 62/180 |
| 7,631,687 B2 * | 12/2009 | Yang | 165/104.33 |
| 2004/0257766 A1 | 12/2004 | Rasmussen et al. | |
| 2007/0125110 A1 | 6/2007 | Gudmundsson et al. | |
| 2008/0105753 A1 * | 5/2008 | Carlsen et al. | 236/1 C |

FOREIGN PATENT DOCUMENTS

| | | |
|---|---|---|
| EP | 1416783 A1 | 5/2004 |
| WO | 0237918 A1 | 5/2002 |

* cited by examiner

*Primary Examiner* — Cassey D Bauer
(74) *Attorney, Agent, or Firm* — Murphy, Bilak & Homiller, PLLC

(57) ABSTRACT

The present invention relates to a method in a cabinet and a cabinet for controlling the temperature inside the cabinet. The cabinet is comprised in a radio network node. The cabinet comprises a first set of electronic equipment and a second set of electronic equipment, a first climate system and a second climate system. The first and second climate systems are arranged to transfer heat from an internal volume to an external volume of the cabinet. A first air flow is generated using a first air moving device of the first climate system, which first air flow substantially affects the first set of electronic equipment. A second air flow is generated using a second air moving device of the second climate system, which second air flow substantially affects the second set of electronic equipment. A temperature is measured within the internal volume by using a temperature sensor. Then, each of the respective air moving devices of the first climate system and the second climate system are individually controlled based on a temperature measurement, such that the air within the internal volume is mixed and such that a third air flow is generated substantially affecting both the first and the second set of electronic equipment to thereby obtain an even temperature distribution within said internal volume of the cabinet.

9 Claims, 5 Drawing Sheets

METHOD AND CABINET FOR CONTROLLING TEMPERATURE IN THE CABINET

TECHNICAL FIELD

The present invention relates to a method in a cabinet and a cabinet for controlling the temperature within the cabinet, which cabinet is provided with electronic equipment. The cabinet is comprised in a radio network node.

BACKGROUND

Generally, a radio communication system of today comprises a radio access network and a number of communication devices. The radio access network is built up of several nodes, in particular, radio base stations. The primary task of a radio base station is to send and receive information to/from the communication devices within a cell served by the radio base station. In many cases, the base station runs 24 hours a day. Therefore, it is of particular interest and importance to ensure that the base station is operable predictably and reliably. The radio base station further comprises an enclosure, such as a cabinet, for housing circuitry, or electronic equipment, for performing different tasks of the radio base station. For example, the circuitry may comprise a power control unit, a radio unit, comprising a radio amplifier, a filtering unit for performing corresponding tasks.

Due to low efficiency in the radio amplifier of the radio base station, heat generated in the circuitry of the base station, in particular the radio unit, may not always dissipate naturally to a sufficiently high degree. Instead, heat is accumulated in the circuitry and the temperature of the circuitry increases. The increased temperature of the circuitry may decrease the performance of circuitry within the radio base station, e.g. the circuitry within the radio base station may fail. Consequently, unpredicted interruptions in operation of the base station may occur. This is clearly not desired.

Hence, as is known in the art, systems for cooling of heat generating equipment within a radio base station have been developed. These systems are sometimes referred to as climate systems or climate control systems for radio base stations.

According to a prior art technique for cooling of heat generating equipment, fans are used to circulate air through or over the heat generating equipment and through or over one side of a heat exchanger (i.e. an internal side within the enclosure). Moreover, further fans are used to force ambient air through or over the other side of the heat exchanger (i.e. an external side). The heat exchanger comprises a refrigerant that absorbs heat from the air, heated by the electronic equipment, at the internal side within the enclosure. As a result, a transition from liquid phase to gas phase of the refrigerant occurs. The portion of the heat exchanger that is located at the internal side within the enclosure is called evaporator. The gas is, by evaporation, forced to the external side of the heat exchanger, where it dissipates heat to ambient air. As a result, a transition from gas phase to liquid phase of the refrigerant occurs in the external side of the heat exchanger. The portion of the heat exchanger that is located on the external side is called condenser. At this stage, gravity forces the liquid to flow towards the evaporator. This kind of heat exchanger is generally denoted a thermosiphon. Further, a climate system needs to be equipped with some kind of temperature measuring device to help regulate the climate system.

An enclosure or cabinet of a predetermined size may be provided with different kinds of electronic equipment and in different amounts depending on particular demands from a user. Further, the amount of cables within cabinets that are heavily equipped may be considerable, and may therefore influence the movement of air to and from different parts of the cabinet. Accordingly, the amount of dissipated heat and the location of dissipated heat within a cabinet having a certain size and a certain climate system may vary substantially depending on the type of electronic equipment, its location within the cabinet as well as the amount of different electronic equipment. This may lead to temperature variations within the cabinet, which in turn leads to poor performance of the equipment. Therefore, in many prior art climate systems there is a problem with controlling the temperature within the cabinet.

As may be realized from the above, there is a need for improvement in the field of climate systems for radio network nodes, such as radio base stations. Particularly, there is a need for improvements in controlling the temperature within the cabinet, which cabinet is provided with electronic equipment and a climate system.

SUMMARY

An object of the present invention is to obviate the above disadvantage and provide an improved method in a cabinet and a cabinet for controlling the temperature within the cabinet.

A further object may be to provide an improved method and cabinet comprising climate systems for controlling the temperature within the cabinet, wherein the climate systems may be readily modified depending on the amount of electronic equipment housed within the cabinet.

According to an aspect of the invention, at least one of the objects is achieved by a method in a cabinet for controlling the temperature inside the cabinet. The cabinet is comprised in a radio network node. The cabinet comprises a first set of electronic equipment and a second set of electronic equipment, a first climate system and a second climate system. The first and second climate systems are arranged to transfer heat from an internal volume to an external volume of the cabinet. A first air flow is generated using at least one first air moving device of the first climate system, which first air flow substantially affects the first set of electronic equipment. A second air flow is generated using at least one second air moving device of the second climate system, which second air flow substantially affects the second set of electronic equipment. A temperature is measured within the internal volume by using a temperature sensor. Each of the respective air moving devices of the first climate system and the second climate system are individually controlled based on a temperature measurement, such that the air within the internal volume is mixed and such that a third air flow is generated substantially affecting both the first and the second set of electronic equipment to thereby obtain an even temperature distribution within said internal volume of the cabinet.

According to another aspect of the invention, at least one of the objects is achieved by a cabinet for controlling the temperature inside the cabinet. The cabinet is comprised in a radio network node and the cabinet comprises a first set of electronic equipment and a second set of electronic equipment, a first climate system and second climate system. The first and second climate systems are arranged to transfer heat from an internal volume to an external volume of the cabinet. The first climate system comprises at least one first air moving device arranged to generate a first air flow, which first air flow substantially affects the first set of electronic equipment. The second climate system comprises at least one second air moving device arranged to generate a second air flow, which second air flow substantially affects the second set of electronic equipment. The cabinet comprises a temperature sensor arranged to measure a temperature within the internal volume. The cabinet further comprises a control unit arranged to individually control each of the respective air moving devices of the first climate system and the second climate system based on a temperature measurement, such that the air within the internal volume is mixed and such that a third air flow is generated substantially affecting both the first and said second set of electronic equipment to thereby obtain an even temperature distribution within the internal volume of the cabinet.

An advantage with the method and cabinet of the present invention is that an even temperature is obtained throughout the cabinet by means of individually controlling the respective air moving devices. In this way, any large temperature differentials within the cabinet is avoided which is beneficial for the electronic equipment. Hot spots and/or cold spot which may harm the electronic equipment are avoided. As an even temperature distribution in the internal volume is obtained by generating the third air flow, a temperature measurement that is representative for the whole internal volume is obtained from a temperature sensor, irrespective of the location of the temperature sensor within the cabinet. Further, it may therefore be sufficient to arrange a single temperature sensor within the internal volume of the cabinet.

It is also an advantage to provide modularized climate systems in the sense that each set of electronic equipment is affected by its own climate system but with the possibility of generating a third air flow mixing the air within the cabinet and which third air flow affects all sets of electronic equipment within the cabinet. A modularized climate system may be easily updated, by removing, adding or replacing parts in the case of changes in the amount or type of the electronic equipment within the cabinet. Therefore, with the provision of modularized climate systems a flexible and cost effective method and cabinet is provided for.

Hence, an improved method and cabinet for controlling the temperature within the cabinet is provided in accordance with at least an object of the invention.

According to an embodiment of the method, each of the respective air moving devices of the first climate system and the second climate system are individually controlled by increasing the speed of the first or the second air moving device in the first or second climate system and decreasing the speed of the air moving device in the other climate system, whereby the third airflow is generated which is adapted to mix the air within the internal volume of the cabinet.

For cost reasons, only one temperature sensor may be used within a cabinet. However, it is of great importance that the temperature measured by this single temperature sensor is reliable and representative for the internal volume as a whole. The temperature sensor needs to be mounted in a way that it is able to measure a representative temperature of the internal volume. By providing individual control of the air moving devices the present invention obtains a third air flow mixing the air within the internal volume. By mixing the air an even temperature distribution is obtained and therefore a reliable temperature measurement may be obtained even in the case that a single temperature sensor is used.

According to another embodiment of the method, each of the respective air moving devices of the first climate system and the second climate system are individually controlled when the temperature measured within the internal volume of the cabinet is approximately +25 degrees Celsius or below.

The individual control of the respective air moving devices in the climate systems may be started at a temperature of approximately +25 degrees Celsius or below, measured somewhere in the internal volume. By doing so development of large temperature differences within the internal volume may be avoided.

According to a further embodiment of the method, the air within the internal volume is heated by providing a heater within the cabinet.

By providing a heater to one of the climate systems within the cabinet there is a possibility to warm the air within the cabinet if necessary. In the present method and cabinet for controlling the temperature within the cabinet it may be sufficient with one heater, which is cost effective as well as space saving inside the cabinet. The provision of the individually controlled air moving devices together with a heater within the cabinet gives an even and accurate distribution of warm air within the cabinet. Further, a reliable temperature control within the cabinet is provided for also in the case of low ambient temperatures. This is an advantage for the electronic equipment within the cabinet and to the radio network node as a whole.

According to an embodiment of the method, the air within the internal volume of the cabinet is heated when the temperature within the internal volume is approximately +5 degrees Celsius or below.

A too low temperature inside the cabinet may harm the electronic equipment. By providing heating of the air in the internal volume with start at a certain minimum temperature, a too low temperature inside the cabinet is avoided.

According to an embodiment of the cabinet, the first and second climate systems each comprises a heat exchanging unit. The heat exchanging unit comprises an evaporator adapted to be arranged in the internal volume, a condenser adapted to be arranged in the external volume, a first conduit leading from the evaporator to the condenser, a second conduit leading from the condenser to the evaporator and a refrigerant being present in a refrigerant circuit formed by the heat exchanging unit.

According to a further embodiment of the cabinet, the cabinet further comprises a third climate system. The third climate system comprises a heat exchanging unit for transferring heat from the internal volume to the external volume and at least one air moving device for creating a fourth air flow within the internal volume of the cabinet.

Further electronic equipment may be added, exchanged or removed from the cabinet at a later stage and the climate systems may need to be changed accordingly. For example, if a small amount of electronic components was installed in the cabinet from the beginning the climate systems were designed to meet the requirements for the installed equipment. If later on more electronic equipment is added, a further climate system may be added to the cabinet.

According to an embodiment of the cabinet, the radio network node is a radio base station.

It is to be understood that the radio network node may be a Radio Base Station (RBS) or any other kind of node in a radio communication system, which radio network node comprises heat generating electronic equipment. Examples of other kinds of nodes are transmission nodes, Remote Subscriber Switches (RSS) and nodes with similar functionality.

BRIEF DESCRIPTION OF THE DRAWINGS

The various aspects of the invention, including its particular features and advantages, will be readily understood from the following detailed description and the accompanying drawings, in which.

DETAILED DESCRIPTION OF PREFERRED EMBODIMENTS

The present invention will now be described more fully with reference to the accompanying drawings, in which example embodiments are shown. However, this invention should not be construed as limited to the embodiments set forth herein. Disclosed features of example embodiments may be combined as readily understood by one of ordinary skill in the art to which this invention belongs. Like numbers refer to like elements throughout.

As used herein, the expression "cabinet" relates to any housing or enclosure suitable for holding or be arranged with electronic equipment used in a radio network node.

Figure 1:
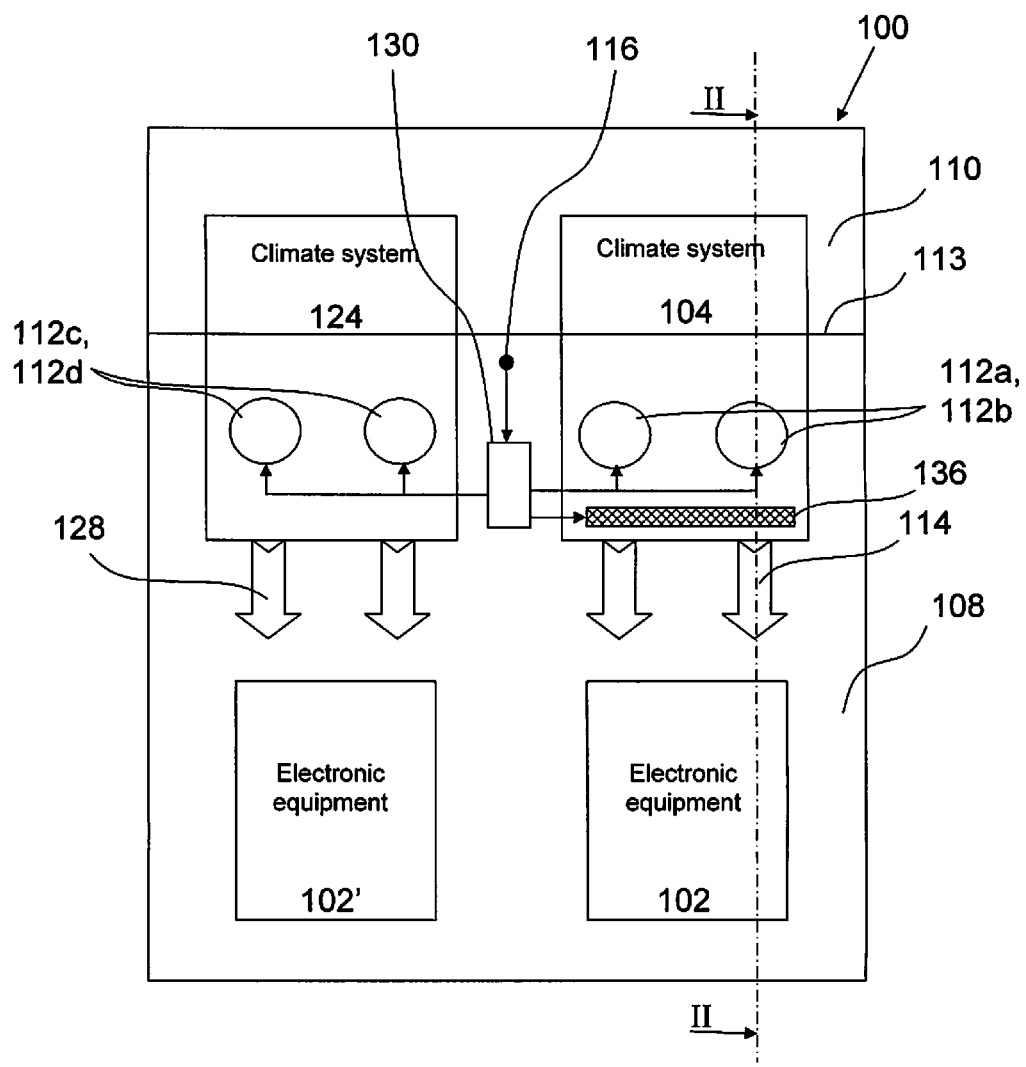
FIG. 1 illustrates a front view of a schematic cabinet comprising electronic equipment for a radio network node according to an embodiment of the present invention.

FIG. 1 shows a front view of a schematic cabinet 100 to be located in a radio network node, such as a radio base station. The cabinet 100 is defined by outer walls and is divided into an internal volume 108 and an external volume 110 by a partitioning wall 113. The external volume 110 is in contact with the ambient atmosphere, for example by openings in the cabinet wall surrounding the external volume 110. Within the internal volume 108 the cabinet houses electronic equipment 102, 102'. In the illustrated example, a first 102 and a second set 102' of electronic equipment are provided within the cabinet 100. The electronic equipment may be for example, a radio unit, comprising a radio amplifier, a filtering unit for performing corresponding tasks, a digital unit comprising equipment for digital signal processing and a power control unit, such as batteries. In the illustrated example in FIG. 1, the cabinet 100 comprises two climate systems, a first climate system 104 and a second climate system 124. The climate systems are provided in the cabinet 100 to regulate the temperature within the cabinet. The first climate system 104 comprises a first air moving device 112a, 112b. The second climate system 124 comprises a second air moving device 112c, 112d. The air moving devices may be for example fans. In the illustrated example, the first and second air moving devices respectively comprise two fans each. The first climate system 104 is in the illustrated example provided the first air moving device 112a, 112b for generating a first airflow 114 illustrated by a block arrow substantially affecting the first set of electronic equipment 102. The second climate system 124 is in the illustrated example provided with the second air moving device 112c, 112d for generating a second airflow 128 illustrated by a block arrow substantially affecting the second set of electronic equipment 102'. It may be realized that the number of fans in each air moving device may be varied, and may be at least one but may also be more than two.

The cabinet further comprises a control unit 130 that is adapted to control the different parts of the climate systems 104, 124. Specifically, the control unit 130 is adapted to control the respective air moving devices 112a, 112b, 112c, 112d. Further, the internal volume 108 comprises a temperature sensor 116 for measuring the temperature therein. Furthermore, the cabinet 100 may comprise a heater 136 to be used in case of low ambient temperatures which make the temperature within the cabinet fall to such an extent that the air within the cabinet needs to be heated. Normally, heating may be required when the temperature in the internal volume is somewhere in the interval of +0 degrees Celsius to +10 degrees Celsius. More specifically, heating of the air within the cabinet is performed when the temperature in the internal volume is approximately +5 degrees Celsius or below. The heater 136 in the illustrated example is located in the first climate system 104. The heater 136 used in the illustrated embodiments may be any kind of resistor heater, such as a metal tube heater or a Positive Temperature Coefficient-heater (PTC-heater), for example.

Figure 2:
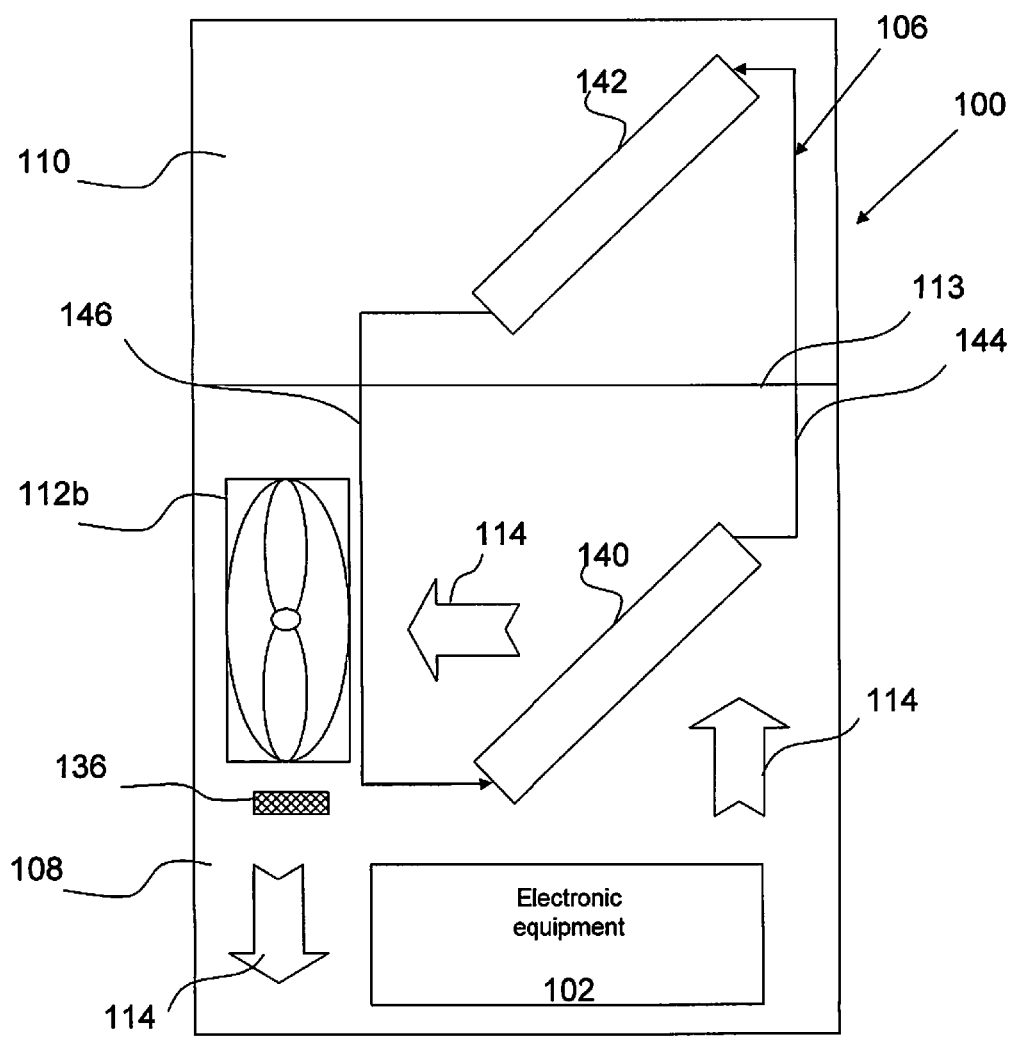
FIG. 2 shows a cross sectional side view along the line II-II of the schematic cabinet of FIG. 1.

In FIG. 2 a cross section along the line II-II of the cabinet in FIG. 1 is shown. Each climate system 104, 124 comprises a heat exchanging unit 106 for transferring heat generated by the electronic equipment 120 to the external volume 110 of the cabinet 100. The heat exchanging unit 106 defines a refrigerant circuit which comprises an evaporator 140, a first conduit 144, a condenser 142 and a second conduit 146. Inside the refrigerant circuit there is a refrigerant. The refrigerant in liquid form inside the evaporator 140 evaporates and rises in gas form through the first conduit 144 to the condenser 142. Inside the condenser 142 the refrigerant in gas form condenses to liquid and flows through the second conduit 146 back to the evaporator 140. In this manner the refrigerant self-circulates in the refrigerant circuit. The evaporator 140 of the heat exchanging unit 106 is arranged inside the internal volume 108 of the cabinet 100. Further in the heat exchanging unit the first conduit 144 leads from the evaporator 140 through the partition wall 113 to the condenser 142 arranged in the external volume 110. From the condenser 142 the second conduit 146 leads back to the evaporator 140. The first air moving device 112a, 112b of the first climate system 104 generates the first air flow 114 circulating the air within the internal volume 108 and substantially affecting the first set of electronic equipment 102. The air flow 114 then sweeps over the evaporator 140 on the way back to the first air moving device 112a, 112b (of which only a part is visible in FIG. 2). Heat in the air surrounding the electronic equipment 102 is transferred from the electronic equipment to the evaporator and heat is thus transferred from the internal volume 108 to the external volume 110 of the cabinet 100.

The different parts of a climate system 104, 124, such as heat exchanging unit 106, air moving devices 112a, 112b, 112c, 112d and heater 136, may be provided and installed into a cabinet 100 as separate units, i.e. a modularized climate system. Such a modularized climate system can be used for a cabinet to achieve versatility. In this way, the same cabinet may then be used for different amount of electronic equipment and a climate system can, if modularized be dimensioned accordingly in discrete steps. The temperature sensor 116 may be a part in one of the climate system 104, 124 or it may be provided on its own some where in the internal volume 108. However, a climate system 104, 124 may also be composed of its different components and then installed into the cabinet as a prepared climate system unit. The first climate system 104 is located such that it will substantially affect the first set of electronic equipment 102. The second climate system 124 is located such that it will substantially affect the second electronic equipment 102'. The different parts of the climate systems 104, 124 are connected or coupled to the controller 130 with cables (not shown), illustrated by arrows in the figures.

In use, the sets of electronic equipment 102, 102' inside the cabinet 100 generate heat. Depending inter alia on generated heat, construction and amount of the electronic equipment 102, 102' and on ambient conditions such as temperature, air movement (e.g. wind) and precipitation (e.g. rain), the temperature inside the cabinet 100 may increase to a level which could harm the electronic equipment. The heat exchanging unit 106 together with the air moving devices are arranged to cool the air in the internal volume 108 of the cabinet 100 to avoid such harmful temperature levels. A too low temperature may also harm or impair the functioning of the electronic equipment. Therefore, heating could become necessary under certain ambient conditions. A suitable aim of example embodiments may be to keep the temperature inside the cabinet 100 below +60 degrees Celsius but above +5 degrees Celsius.

FIG. 1 illustrates a first operational mode, which may be referred to as a normal mode or a cooling mode in which mode the electronic equipment within the internal volume needs to be cooled, i.e. heat needs to be transferred from the internal volume 108 to the external volume 110. In such a cooling mode, the first and second air moving devices 112a, 112b, 112c, 112d run at approximately the same speed to provide and maintain the first and second air flows 114, 128, respectively affecting the first and second sets of electronic equipment 102, 102'. The climate systems 104, 124 run according to the cooling mode when the temperature within the cabinet 100 is approximately higher than +25 degrees Celsius. The heater is normally not to be used in this mode.

Figure 3:
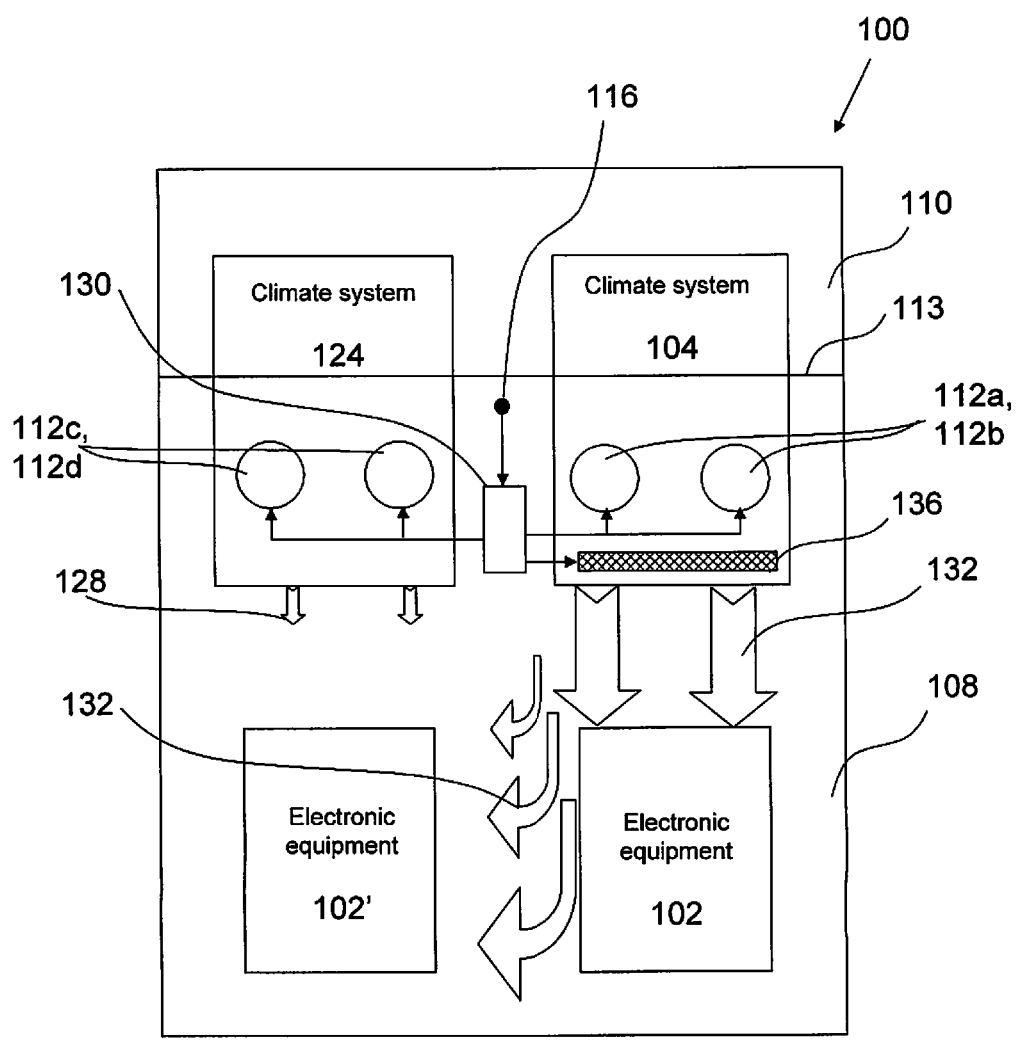
FIG. 3 illustrates a front view of the schematic cabinet according to FIG. 1 in a another operational mode.

FIG. 3 illustrates the cabinet of FIG. 1 but in a second operational mode, a so called air mixing mode or heating mode. In the second operational mode illustrated in FIG. 3, the air within the internal volume 108 is mixed in order to obtain an even temperature distribution within the internal volume, for example during use of the heater 136 or during falling outdoor temperature that will affect the temperature within the internal volume. The air mixing mode may be started as a response to a temperature measured by the temperature sensor 116 that falls below +25 degrees Celsius. The falling temperature within the internal volume 108 may be caused by a falling ambient temperature or decreased heat dissipation from the electronic equipment or a combination of the two. When a temperature sensor input of below +25 degrees Celsius is given to the control unit 130, the control unit will start the individual control of the respective air moving devices of the first and second climate systems 104, 124. By doing this a third air flow 132 is generated within the internal volume 108. The individual control is obtained by decreasing the speed of the respective air moving devices in one of the first or second climate system. In the illustrated example in FIG. 3, the air moving devices 112c, 112d of the second climate system 124 are decreased. The speed of the two air moving devices 112c, 112d is set to a minimum, which means as close to zero as possible but without turning them off completely. By keeping a minimum speed of the two air moving devices 112c, 112d, a certain pressure is kept on the air moving devices which pressure is enough to prevent that they start to let the air through in the opposite direction. In the other climate system, which in the illustrated example is the first climate system 104, the speed of the respective air moving devices 112a, 112b is increased and thus the third air flow 132 is generated. The third air flow 132 will replace the first air flow 114 and the second air flow 128 is close to zero. This third air flow 132 affects both the first 102 and the second 102' set of electronic equipment.

Further, if a temperature lower than +5 degrees Celsius is measured in the internal volume 108, the air within the cabinet may need to be warmed. Such a heating mode is identical to the described air mixing mode but with the difference that the heater 136 is turned on. Thereby, the third air flow 132 is generated for mixing the air in the internal volume 108 and to evenly distribute air warmed by the heater throughout the internal volume.

Figure 4:
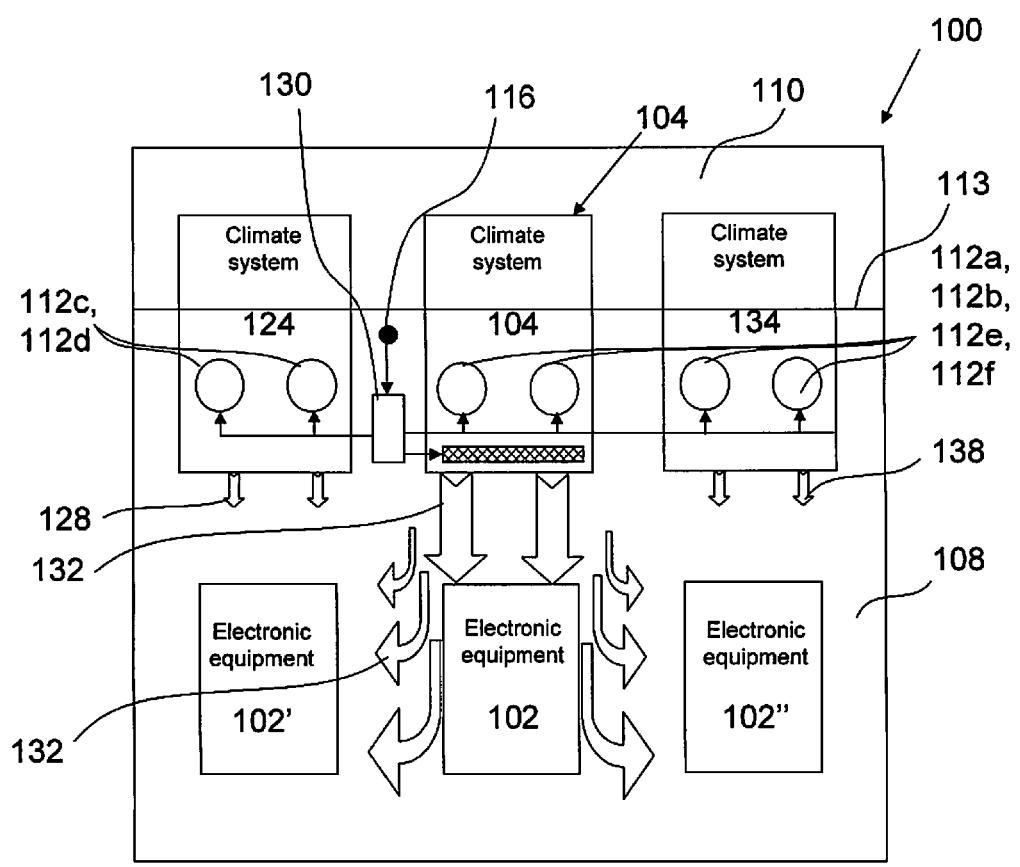
FIG. 4 illustrates a front view of a schematic cabinet comprising electronic equipment for a radio network node according to another embodiment of the present invention.

FIG. 4 illustrates another embodiment of a cabinet 100 for controlling the temperature inside the cabinet 100. According to the illustrated embodiment, a third set of electronic equipment 102" is arranged within the internal volume 108. A further, i.e. a third climate system 134 is thus also provided within the cabinet 100. The third climate system 134 comprises a third air moving device 112e, 112f for generating a fourth air flow 138 substantially affecting the third set of electronic equipment 102" in a cooling mode. The embodiment illustrated in FIG. 4 is shown in an air mixing mode or heating mode, thus when a third air flow 132 is generated in the internal volume 108 for mixing the air and obtain an even temperature distribution. When the third air flow 132 is generated, the second 128 and fourth air flow 138 will be close to zero and the first air flow 114 is replaced by the third air flow 132 mixing the air within the internal volume 108. This third air flow 132 affects both the first 102, the second 102' and the third 102" set of electronic equipment. A configuration similar to the illustrated embodiment in FIG. 4 may be used for example when the cooling requirements in the cabinet differ substantially between the different sets of electronic equipment.

Figure 5:
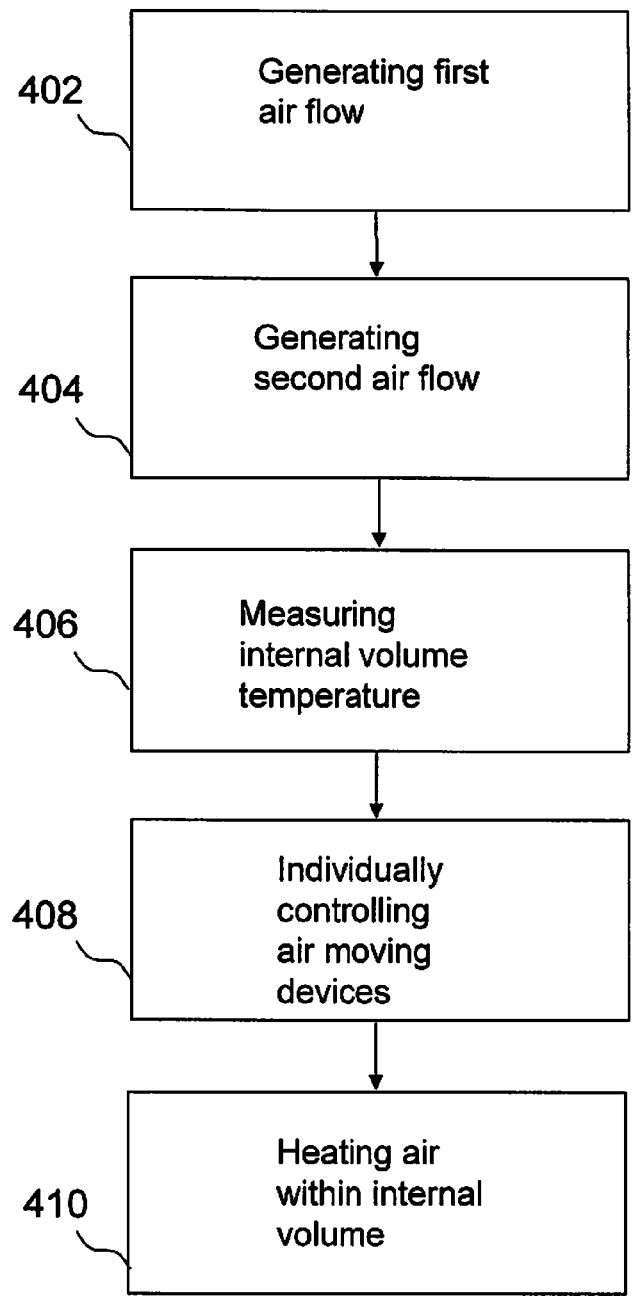
FIG. 5 is a flow chart showing a method in a cabinet for controlling the temperature within the cabinet.

The method steps in the cabinet 100 for controlling the temperature within the cabinet 100 will now be described with reference to a flow chart depicted in FIG. 5. As mentioned above, the cabinet 100 comprises a first set of electronic equipment 102, and a second set of electronic equipment 102', a first climate system 104 and second climate system 124, which first and second climate system 104, 124 are arranged to transfer heat from an internal volume 108 to an external volume 110 of the cabinet 100, the method comprising the steps of:

402. Generating a first air flow 114, using a first air moving device 112a, 112b of the first climate system 104, which first air flow substantially affects the first set of electronic equipment 102.

404. Generating a second air flow 128, using a second air moving device 112c, 112d of the second climate system 124, which second air flow substantially affects the second set of electronic equipment 102'.

406. Measuring a temperature within the internal volume 108 using a temperature sensor 116.

408. Individually controlling each of the respective air moving devices 112a, 112b, 112c, 112d of the first climate system 104 and the second climate system 124 based on a temperature measurement, such that the air within the internal volume 108 is mixed and such that a third air flow 134 is generated substantially affecting both the first and the second set of electronic equipment 102, 102' to thereby obtain an even temperature distribution within the internal volume 108 of said cabinet 100.

410. This step is optional. Heating the air within the internal volume 108 by providing a heater 136 within said cabinet 100.

According to the method in a cabinet of the present invention, a third air flow mixing the air within the internal volume is generated as a response to a temperature measurement which falls within a predetermined interval. The mixing of air within the internal volume ensures that an even temperature distribution is obtained within the internal volume. Further, when the optional step 410 is performed the third air flow provides a reliable and efficient distribution of heated air within the internal volume.

Example embodiments may be combined as understood by a person skilled in the art. Therefore, it is to be understood that the foregoing is illustrative of various example embodiments and is not to be limited to the specific embodiments disclosed and that modifications to the disclosed embodiments, combinations of features of disclosed embodiments as well as other embodiments are intended to be included within the scope of the appended claims.

The invention claimed is:

1. A method in a cabinet for controlling the temperature inside the cabinet, which cabinet is comprised in a radio network node, said cabinet comprising a first set of electronic equipment, and a second set of electronic equipment, a first climate system and second climate system, which first and second climate system are each stand-alone systems and each includes a respective air moving device and a respective condenser unit, the condenser units being located outside the cabinet, and are arranged to transfer heat from an internal volume to an external volume of said cabinet, the method comprising:
    generating a first air flow, using a first air moving device of said first climate system, which first air flow substantially affects the first set of electronic equipment;
    generating a second air flow, using a second air moving device of the second climate system, which second air flow substantially affects the second set of electronic equipment;
    measuring a temperature within said internal volume using a temperature sensor; and
    individually controlling each of the respective air moving devices of said first climate system and said second climate system based on the measured temperature, such that the air within said internal volume is mixed and such that a third air flow is generated, substantially affecting both said first and said second set of electronic equipment to thereby obtain a substantially even temperature distribution within said internal volume of said cabinet;
wherein the step of individually controlling each of the respective air moving devices of said first climate system and said second climate system includes the further steps of:
    increasing the speed of said first or said second air moving device in said first or second climate system; and
    decreasing the speed of the air moving device in the other climate system, whereby said third airflow is generated, adapted to mix the air within said internal volume of said cabinet; and
wherein the step of individually controlling each of the respective air moving device of said first climate system and said second climate system is performed when the measured temperature within said internal volume of said cabinet is approximately +25 degrees Celsius or below.

2. The method of claim 1, wherein the method further comprises heating the air within said internal volume by providing a heater within said cabinet.

3. The method of claim 2, wherein the step of heating is performed when the measured temperature within said internal volume of said cabinet is +5 degrees Celsius or below.

4. A cabinet for controlling the temperature inside the cabinet, which cabinet is comprised in a radio network node, said cabinet comprising:
    a first set of electronic equipment, and a second set of electronic equipment, a first climate system and second climate system, which first and second climate systems are each stand-alone systems and each includes a respective air moving device and a respective condenser unit, the condenser units being located outside the cabinet, and are arranged to transfer heat from an internal volume to an external volume of said cabinet,
    said first climate system comprising a first air moving device arranged to generate a first air flow, which first air flow substantially affects the first set of electronic equipment, and
    said second climate system comprising a second air moving device arranged to generate a second air flow, which second air flow substantially affects the second set of electronic equipment,
    the cabinet further comprising a temperature sensor arranged to measure a temperature within said internal volume, and
    the cabinet further comprising a control unit arranged to individually control each of the respective air moving devices of said first climate system and said second climate system based on the measured temperature, such that the air within said internal volume is mixed and such that a third air flow is generated substantially affecting both said first and said second set of electronic equipment to thereby obtain a substantially even temperature distribution within said internal volume of said cabinet;
wherein the control unit is further arranged to increase the speed of said first or second air moving device in said first or second climate system, and arranged to decrease the speed of said other air moving device in the other climate system, whereby said third airflow is generated, adapted to mix the air within said internal volume of said cabinet; and
wherein the control unit is arranged to individually control each of the respective air moving devices of said first climate system and said second climate system when the measured temperature within said internal volume is approximately +25 degrees Celsius or below.

5. The cabinet of claim 4, wherein the cabinet further comprises a heater for heating air within the internal volume of said cabinet.

6. The cabinet of claim 5, wherein said heater is arranged to heat the air within said internal volume when the measured temperature within said internal volume is approximately +5 degrees Celsius or below.

7. The cabinet of claim 4, wherein said first and second climate systems each comprise a heat exchanging unit comprising an evaporator adapted to be arranged in said internal volume, a condenser adapted to be arranged in said external volume, a first conduit leading from said evaporator to said condenser, a second conduit leading from said condenser to said evaporator and a refrigerant being present in a refrigerant circuit formed by said heat exchanging unit.

8. The cabinet of claim 4, wherein said cabinet further comprises a third climate system, said third climate system comprising a heat exchanging unit for transferring heat from said internal volume to said external volume and a third air moving device for creating a fourth air flow within said internal volume of said cabinet.

9. The cabinet of claim 4, wherein the radio network node is a radio base station.

* * * * *